United States Patent
Frost et al.

(10) Patent No.: US 9,766,297 B2
(45) Date of Patent: Sep. 19, 2017

(54) BATTERY SYSTEM CAPACITY ESTIMATION SYSTEMS AND METHODS

(71) Applicant: GM GLOBAL TECHNOLOGY OPERATIONS LLC, Detroit, MI (US)

(72) Inventors: Patrick Frost, Berkley, MI (US); Patricia M. Laskowsky, Ann Arbor, MI (US); John E. Novak, Dexter, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 167 days.

(21) Appl. No.: 14/738,633

(22) Filed: Jun. 12, 2015

(65) Prior Publication Data

US 2016/0363631 A1    Dec. 15, 2016

(51) Int. Cl.
*H01M 10/44* (2006.01)
*H01M 10/46* (2006.01)
*G01R 31/36* (2006.01)

(52) U.S. Cl.
CPC ..... *G01R 31/3655* (2013.01); *G01R 31/3606* (2013.01); *G01R 31/3651* (2013.01)

(58) Field of Classification Search
CPC ......... H02J 2007/005; H02J 2007/0049; H02J 7/0021; H02J 7/0047
USPC ........ 320/107, 114, 132, 149; 324/426, 427, 324/430, 433
See application file for complete search history.

(56) References Cited

U.S. PATENT DOCUMENTS

| | | | |
|---|---|---|---|
| 2013/0066573 A1* | 3/2013 | Bond | G01R 31/3679 702/63 |
| 2015/0022160 A1* | 1/2015 | Greening | H02J 7/0077 320/162 |
| 2015/0349385 A1* | 12/2015 | Hu | H01M 10/48 429/91 |

* cited by examiner

*Primary Examiner* — Edward Tso
(74) *Attorney, Agent, or Firm* — Phillips Ryther & Winchester; John P. Davis

(57) ABSTRACT

System and methods for estimating a capacity of a battery system and/or a constituent cell and/or pack included in a vehicle are presented. In certain embodiments, a method for estimating a capacity of a battery system may include determining voltage-based state of charge ("SOC") data of a pack of the battery system based on measured pack voltage information and a relationship between an open circuit voltage ("OCV") and the SOC of the pack of at a beginning of life of the pack. Beginning of life SOC data of the pack may be determined based on coulomb counting measurements, and a ratio may be determined based on the beginning of life SOC data of the pack and the voltage-based SOC data of the pack. An estimated present capacity of the pack may be determined based on the beginning of life capacity of the pack and the ratio.

18 Claims, 5 Drawing Sheets

BATTERY SYSTEM CAPACITY ESTIMATION SYSTEMS AND METHODS

TECHNICAL FIELD

This disclosure relates to systems and methods for estimating capacity of a battery system. More specifically, but not exclusively, the systems and methods disclosed herein relate to estimating a capacity of a battery system as the battery system ages.

BACKGROUND

Passenger vehicles often include electric batteries for operating features of a vehicle's electrical and drivetrain systems. For example, vehicles commonly include a 12V lead-acid automotive battery configured to supply electric energy to vehicle starter systems (e.g., a starter motor), lighting systems, and/or ignition systems. In electric, fuel cell ("FC"), and/or hybrid vehicles, a high voltage ("HV") battery system (e.g., a 360V HV battery system) may be used to power electric drivetrain components of the vehicle (e.g., electric drive motors and the like). For example, an HV rechargeable energy storage system ("ESS") included in a vehicle may be used to power electric drivetrain components of the vehicle.

The electrical behavior of a battery system may change over time as the battery system ages. For example, a charge capacity of the battery system may decrease over time and an equilibrium voltage (e.g., an open circuit voltage ("OCV") of the battery system for a given state of charge ("SOC") may shift from its value at the beginning-of-life ("BOL") of the battery system. Conventional methods used in connection with estimating battery system parameter and/or performance information, including battery capacity information, may not account for such changes and may assume that an OCV/SOC relationship for the battery system is static throughout its life. Accordingly, such methods may result in progressively less accurate estimations over time.

SUMMARY

Systems and methods disclosed herein may provide for improved estimation of battery capacity. In certain embodiments, the disclosed systems and methods may account for changes in a relationship between OCV and SOC of a battery system as the battery system ages. Embodiments of the disclosed systems and methods may thus improve the accuracy battery system capacity estimation throughout the life of the battery system. In some circumstances, these improvements may improve the reliability and driving consistency of a vehicle powered by the battery system.

In some embodiments, a method for estimating a capacity of a battery system pack included in a vehicle may include determining voltage-based SOC data of a pack of the battery system based on measured pack voltage information and a relationship between an OCV and the SOC of the pack of at a BOL of the pack. In some embodiments, the relationship between the OCV and the SOC of the pack may comprise an OCV/SOC curve associated with the pack.

BOL SOC data of the pack may be determined based on coulomb counting measurements, and a ratio may be determined based on the BOL SOC data of the pack and the voltage-based SOC data of the pack. In some embodiments, the ratio may comprise a ratio between a BOL capacity of the pack and an estimated present capacity of the pack. In certain embodiments, the ratio may be determined by plotting the BOL SOC data of the pack against the voltage-based SOC data of the pack, performing a line fitting process to identify a line associated with the plotting of the BOL SOC data of the pack and the voltage-based SOC data of the pack (e.g., a recursive least squares process and/or any other suitable line fitting process), determining a slope of the identified line, and determining the ratio based on the identified slope. An estimated present capacity of the pack may be determined based on the beginning of life capacity of the pack and the ratio.

Certain embodiments of the disclosed systems and methods may be applied in connection with estimating a capacity of an entire battery system, a pack, a cell, and/or any other constituent subdivision and/or portion of the battery system. As used herein, a portion of the battery system may comprise an entire battery system and/or any constituent subdivision of the same, a pack (e.g., a pack having a number of cells), a cell, and/or the like. In some embodiments, the method may further comprise implementing a control action in a vehicle and/or determining a battery system operating parameter based on the updated capacity. In certain embodiments, the aforementioned method may be performed by a BSE system and/or any other computing system and/or implemented using a non-transitory computer-readable medium storing associated executable instructions.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
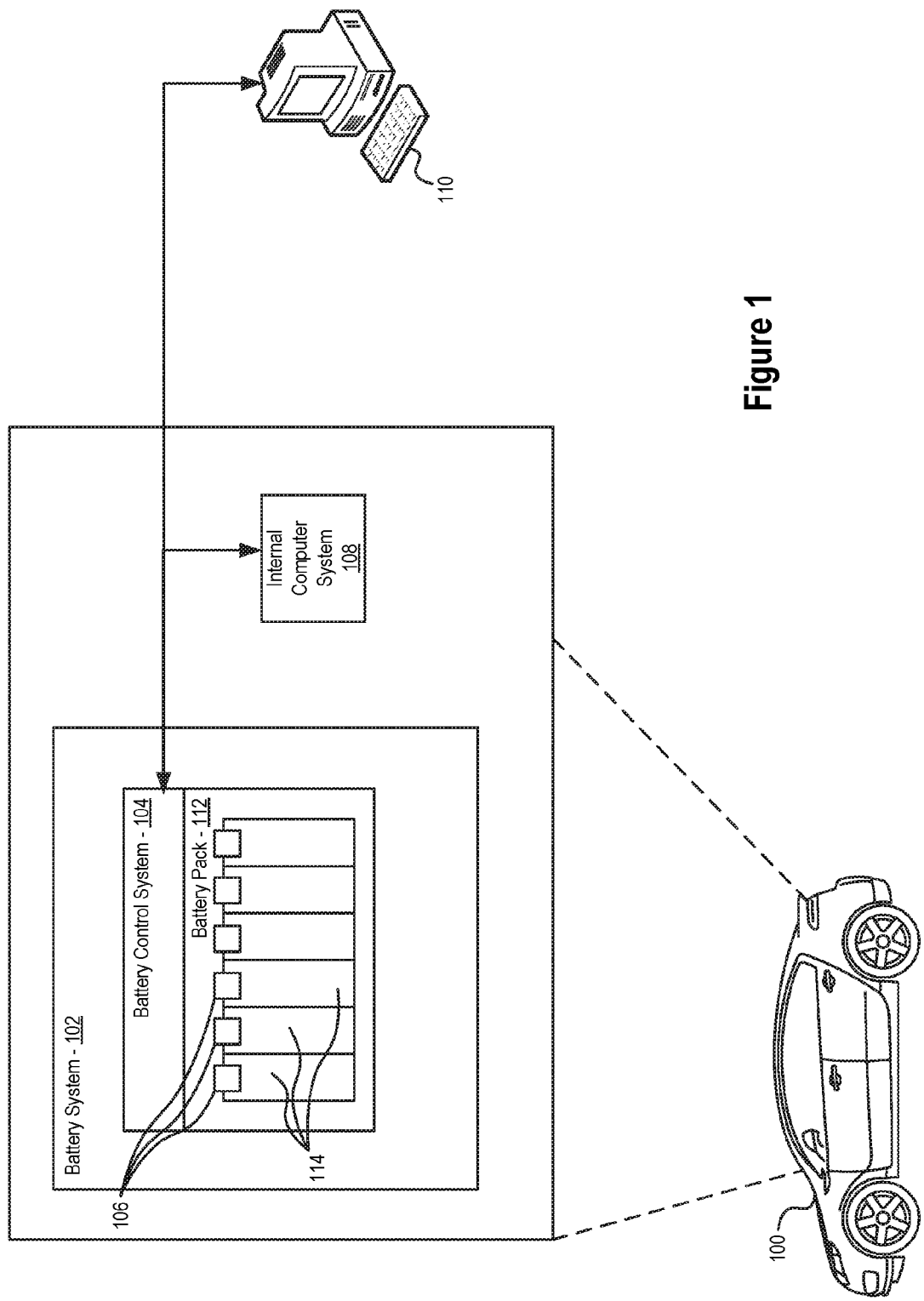
FIG. 1 illustrates an exemplary system for estimating a capacity of a battery system included in a vehicle consistent with embodiments disclosed herein.

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Systems and methods disclosed herein may provide for improved estimation of a capacity of a battery system. In some embodiments, the disclosed systems and methods may be performed by a BSE system and/or any other battery control, monitoring, testing, modeling, and/or management system. Consistent with embodiments of the disclosed systems and methods, changes in an SOC-OCV curve through a lifecycle of the battery system may be accounted for in connection with battery system capacity estimation.

In some embodiments, the disclosed systems and methods may utilize a line fitting algorithm to compute a ratio of a BOL capacity of the battery system to a present battery capacity. Based on the BOL battery capacity and the computed ratio, a present capacity of the battery system may be determined. In some embodiments, an SOC of the battery system may be computed using a nominal BOL capacity (e.g., computed via coulomb counting by measuring battery current and integrating it in time). Data relating to a measured battery pack and/or section voltage, the BOL SOC, and a time that may be utilized in connection when determining the usefulness of the data (e.g., whether the data is too old for use in connection with accurately estimating a capacity of the battery system) may be collected and stored when a vehicle controller and/or BSE system initiates with the battery system in an equilibrium state. In some embodiments, such information may be sorted into one or more data bins based on the BOL SOC of the battery system.

When sufficient data has been collected and it is determined to be sufficiently varied (e.g., covering a variety of SOC ranges), a line fitting process consistent with the disclosed embodiments may initiate. In certain embodiments, because the BOL OCV/SOC curve is known, stored voltages may be converted into a voltage-based SOC. In some embodiments, the voltage-based SOC for a battery system may comprise an SOC that the stored voltage would be if the battery system was at its BOL. In certain circumstances, the voltage-based SOC may be different than the BOL SOC computed and stored by the vehicle controller and/or BSE system discussed above. Consistent with the disclosed embodiments, the BOL SOC may be plotted against the voltage-based SOC resulting in a line, the slope of which may represent a ratio of the BOL capacity to the present capacity. In certain embodiments, any suitable line fitting algorithm (e.g., least-squares, etc.) may be used to find the slope of the line, which may then be used to compute the present capacity as discussed above. In further embodiments, the computed present capacity estimate may be blended into previous estimates.

FIG. 1 illustrates an exemplary system for estimating a capacity of a battery system consistent with embodiments disclosed herein. In certain embodiments, the battery system 102 may be included in a vehicle 100. The vehicle 100 may be a motor vehicle, a marine vehicle, an aircraft, and/or any other type of vehicle, and may include an internal combustion engine ("ICE") drivetrain, an electric motor drivetrain, a hybrid engine drivetrain, an FC drivetrain, and/or any other type of drivetrain suitable for incorporating the systems and methods disclosed herein. The vehicle 100 may include a battery system 102 that, in certain embodiments, may be an HV battery system. The HV battery system may be used to power electric drivetrain components (e.g., as in an electric, hybrid, or FC power system).

In further embodiments, the battery system 102 may be a low voltage battery (e.g., a lead-acid 12V automotive battery) and may be configured to supply electric energy to a variety of vehicle 100 systems including, for example, vehicle starter systems (e.g., a starter motor), lighting systems, ignition systems, and/or the like. Although illustrated in connection with a battery system 102 included in a vehicle 100, it will be appreciated that embodiments of the disclosed systems and methods may be implemented in connection with a wide variety of battery systems including in connection with batteries systems that are not included in a vehicle.

The battery system 102 may include a battery control system 104. The battery control system 104 may be configured to monitor and control certain operations of the battery system 102. For example, the battery control system 104 may be configured to monitor and control charging and discharging operations of the battery system 102. In certain embodiments, the battery control system 104 may be utilized in connection with the methods disclosed herein to estimate, model, and/or otherwise determine a capacity of the battery system. In certain embodiments, the battery control system 104 may be communicatively coupled with one or more sensors 106 (e.g., voltage sensors, current sensors, and/or the like, etc.) and/or other systems (e.g., internal computer system 108, external computer system 110, etc.) configured to enable the battery control system 104 to monitor and control operations of the battery system 102 and/or perform certain methods disclosed herein. For example, sensors 106 may provide battery control system 104 with information used to estimate a SOC, estimate an impedance, measure a current, measure voltage of a battery pack 112 and/or constituent battery cells 114, and/or any other information that may be utilized in connection with the disclosed embodiments.

The battery control system 104 may further be configured to provide information to and/or receive information from other systems (e.g., internal computer system 108) included in the vehicle 100 that, in some embodiments, may comprise BSE systems. For example, the battery control system 104 may be communicatively coupled with an internal vehicle computer system 108 and/or an external computer system 110 (e.g., via a wired and/or wireless telecommunications system or the like) configured to perform BSE methods consistent with the disclosed embodiments. In some embodiments, the internal vehicle computer system 108 and/or an external computer system 110 may be configured to estimate a capacity of a battery system 102 throughout its lifecycle consistent with embodiments disclosed herein In certain embodiments, the battery control system 104 may be configured, at least in part, to provide information regarding the battery system 102 (e.g., information measured by sensors 106 and/or determined by control system 104) to a user, testing personnel, service personnel, and/or the like of the vehicle 100, the vehicle computer system 108, and/or the external computer system 110. Such information may include, without limitation, battery SOC, state of energy ("SOE"), and/or state of health ("SOH") information, battery energy capability and/or capacity information, battery operating time information, battery cycle information, battery operating temperature information, vehicle range information, and/or any other information regarding the battery system 102 that may be utilized in connection with determining battery system energy capacity information and/or information used in connection with battery system 102 and/or vehicle 100 management and/or control operations.

The battery system 102 may include one or more battery packs 112 suitably sized to provide electrical power to the vehicle 100. Each battery pack 112 may include one or more battery cells 114. The battery cells 114 may utilize any suitable battery technology or combination thereof. Suitable battery technologies may include, for example, lead-acid, nickel-metal hydride ("NiMH"), lithium-ion ("Li-Ion"), Li-Ion polymer, zinc-air, lithium-air, nickel-cadmium ("Ni-Cad"), valve-regulated lead-acid ("VRLA") including absorbed glass mat ("AGM"), nickel-zinc ("NiZn"), molten salt (e.g., a Na—$NiCl_2$ battery), and/or other suitable battery technologies. Each battery cell 114 may be associated with sensors 106 configured to measure one or more parameters (e.g., voltage, current, temperature, etc.) associated with each cell 114. Although FIG. 1 illustrates separate sensors 106 associated with each battery cell 114, in some embodiments a sensor configured to measure various electrical parameters associated with a plurality of cells 114 may also be utilized. As used herein, the terms "pack" and/or "cell" may be used to refer to any subsection and/or constituent subdivision (e.g., a cell, a pack, and/or any combination thereof) of a battery system.

Information measured by sensors 106 may be provided to the battery control system 104 and/or one or more other systems (e.g., internal computer system 108 and/or external computer system 110). Using the information, the battery control system 104 and/or any other suitable system may coordinate the operation of battery system 102 (e.g., charging operations, discharging operations, balancing operations, etc.). The battery control system 104, internal computer system 108, external computer system 110, and/or any other suitable system implementing BSE methods may further utilize such information in connection with the disclosed embodiments to estimate a capacity of the battery system 102 as part of monitoring, control, characterization, and/or modeling activities.

Figure 2:
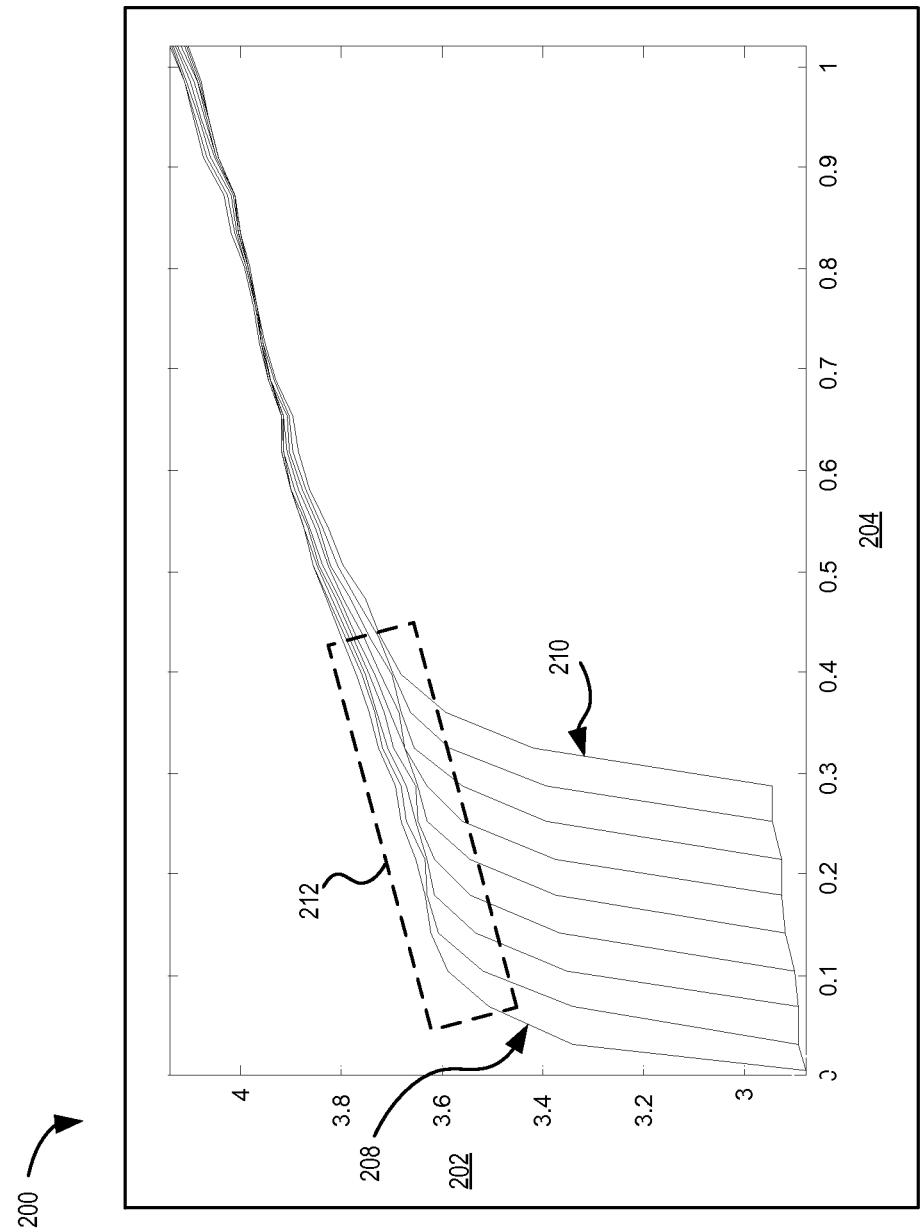
FIG. 2 illustrates a graph showing a relationship between a beginning-of-life SOC and an OCV of an exemplary battery system over time consistent with embodiments disclosed herein.

FIG. 2 illustrates a graph showing a relationship between a SOC and an OCV of an exemplary battery system consistent with embodiments disclosed herein. Particularly, graph 200 illustrates a variety of exemplary SOC/OCV curves throughout a lifecycle of the battery (e.g., from BOL SOC/OCV curve 208 to an aged SOC/OCV curve 210). In the illustrated graph, the x-axis 204 represents a percentage SOC of the battery system normalized to the BOL of the battery system and the y-axis represents the OCV of the battery system in volts.

As shown, when an OCV/SOC curve is not normalized for capacity, the location of certain features in OCV curves of an associated battery system as the battery systems ages may be utilized to determine a ratio between a BOL capacity and an actual capacity. For example, as illustrated, voltage drop-off points 212 of the various OCV/SOC curves may change as the battery ages, which may be utilized to determine the ratio between the BOL capacity and the actual capacity.

Figure 3A:
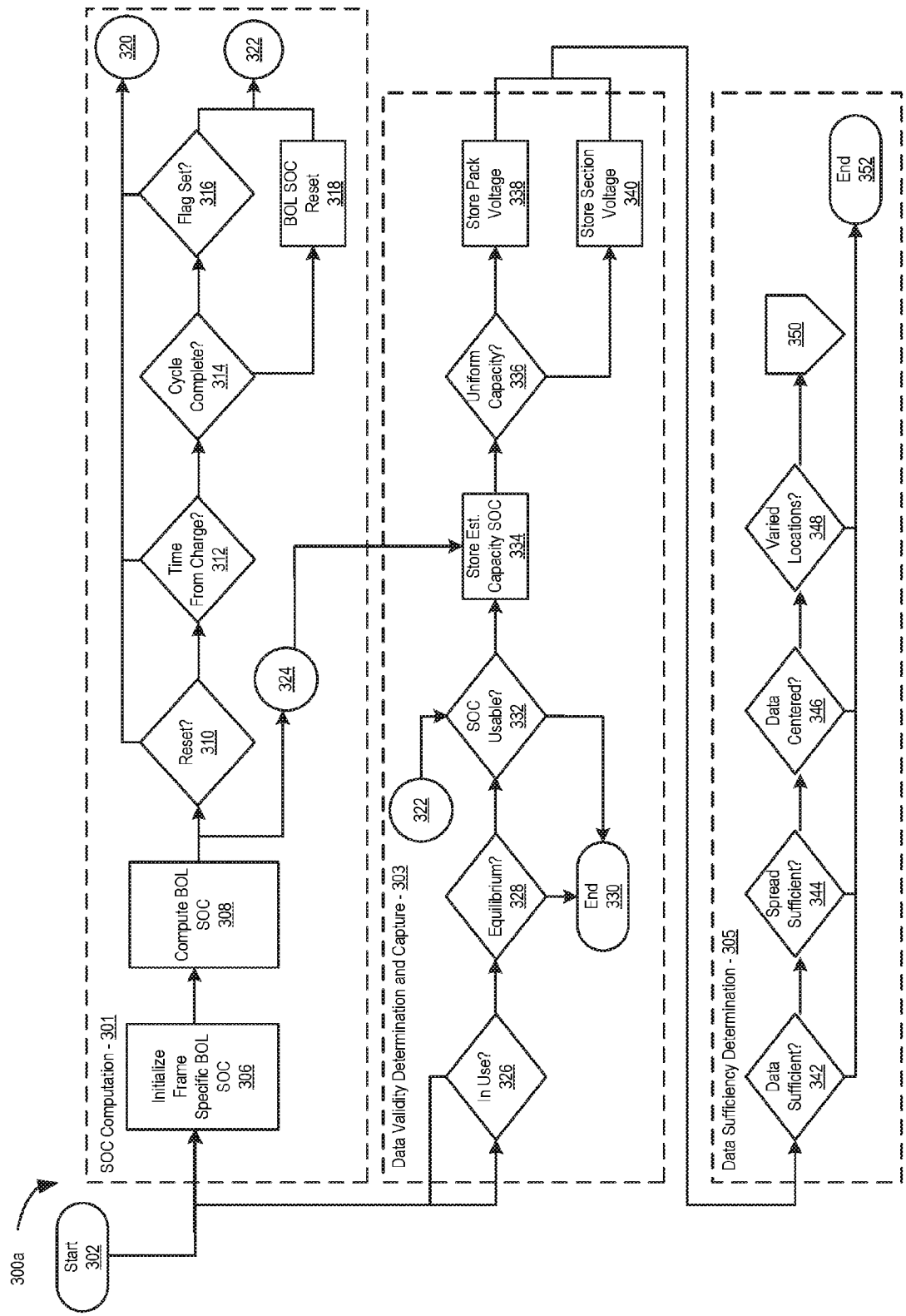
FIG. 3A illustrates a flow chart of a first part of an exemplary method for estimating a capacity of a battery system consistent with embodiments disclosed herein.
Figure 3B:
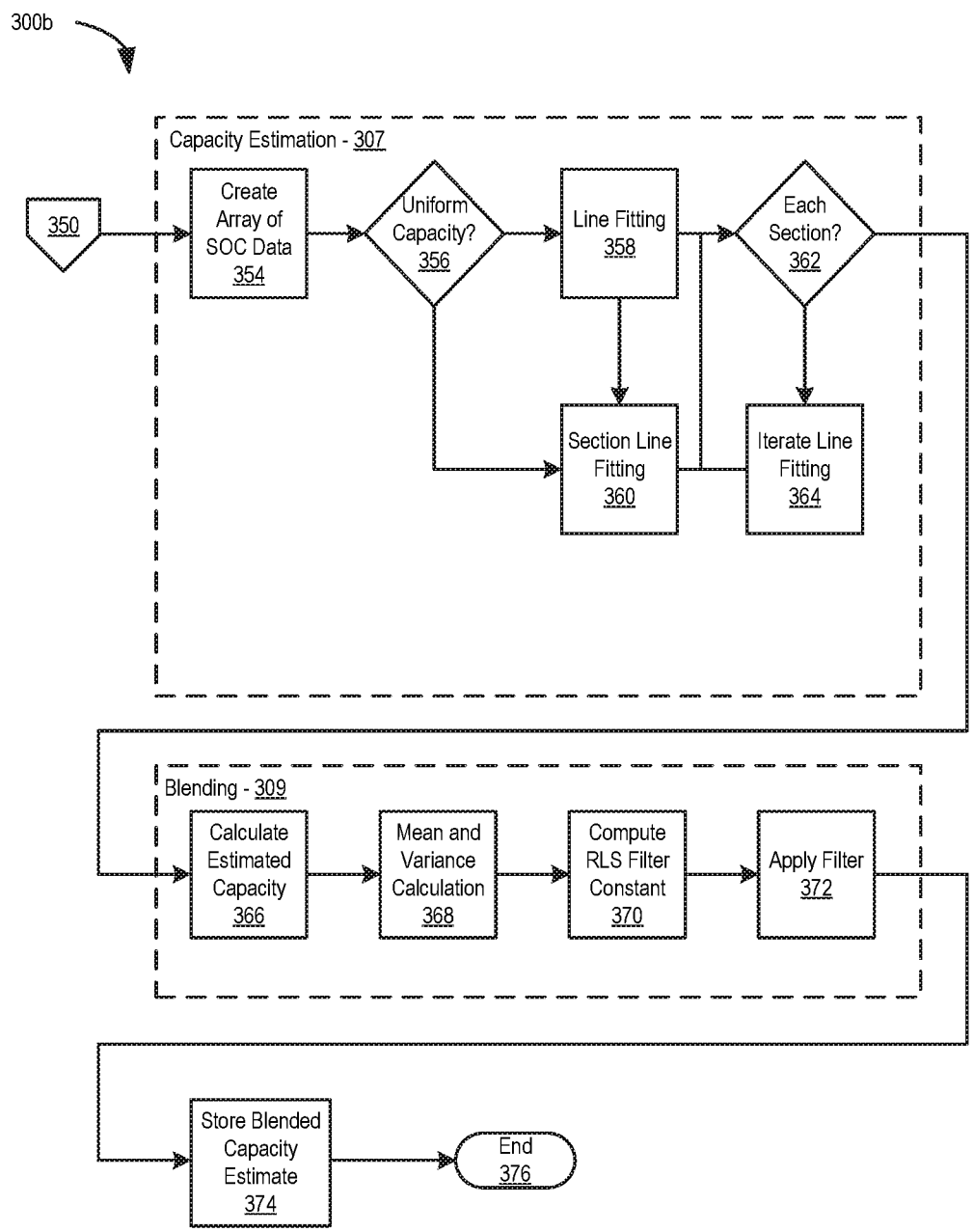
FIG. 3B illustrates a flow chart of a second part of an exemplary method for estimating a capacity of a battery system consistent with embodiments disclosed herein.

FIGS. 3A-3B illustrates flow charts 300a, 300b of an exemplary method for estimating a capacity of a battery system consistent with embodiments disclosed herein. In certain embodiments, one or more of the illustrated elements of the method may be performed by and/or implemented using a battery control system, an internal computer system, an external computer system, and/or any other system or combination of systems configured implemented BSE methods and/or, monitor, model, and/or otherwise characterize parameters of a battery system including capacity of the battery system.

The illustrated method may comprise one or more SOC computation steps 301, data validity determination and capture steps 303, data sufficiency determination steps 305, capacity estimation steps 307, and/or blending steps 309. At 302, the method may initiate. At 306, a frame-specific BOL SOC for the battery system may be initialized. Current may be integrated to compute a BOL SOC for the battery system at 308. As used herein, a frame-specific BOL SOC may be a BOL SOC associated with a particular software functional division. This information may be passed to 324 for use in connection with other steps in the method.

At 310, a determination may be made whether a non-volatile memory reset has occurred (e.g., whether a reset has occurred within a preceding time period or the like). If so, a flag may be set at 320 indicating that the calculated SOC may not be used in connection with the disclosed method, which in some embodiments may cause the method to terminate. If a reset has not occurred, the method may proceed to 312, where a time since a last charge cycle of completion may be compared against a threshold to determine whether too long of time has elapsed. In some embodiments, the threshold may comprise a value that may represent when the integrated current sensor error is too high to calculate an accurate OCV/SOC curve. If the time since the last charge cycle completion is too long, a flag may be set at 320 indicating that the calculated SOC may not be used in connection with the disclosed method, which in some embodiments may cause the method to terminate. If not, the method may proceed to 314.

At 314, a determination may be made whether a charge cycle complete has been triggered. If so, the method may proceed to 318, where the BOL SOC may be reset to a charge termination point of the battery system, and a flag may be set at 322 indicating that the calculated SOC may be used in connection with the disclosed method. Otherwise, the method may proceed to 316, where a determination may be made whether the flag at 322 was previously set (i.e., whether the flag 322 was set indicating that the calculated SOC may be used). If not, a flag may be set at 320 indicating that the calculated SOC may not be used in connection with the disclosed method, which in some embodiments may cause the method to terminate. If so, a flag may be set at 322 indicating that the calculated SOC may be used in connection with the disclosed method.

In certain embodiments, to find the capacity, current may be integrated to compute an SOC that is not set or rest by voltage, thus avoiding creating a circular dependence. SOC may be reset when the battery completes a full charge as the OCV/SOC curve may exhibit less shift at high SOC as the battery ages. If the battery has not been full-charged for a particular duration or the memory storage of a system implementing the disclosed systems and methods has been reset, the SOC calculated may not be used in connection with optimization processes consistent with the disclosed embodiments until a full charge has been completed.

A determination may be made at 326 whether the battery system is in use. If not, the method may wait until the battery system is in use. If so, the method may proceed to 328, where a determination may be made whether the battery system is in an equilibrium state. In some embodiments, an equilibrium state may comprise a state where the battery has been held at open-circuit for a sufficiently long time so that polarization built up by charging and discharging the battery has dissipated and/or there are no and/or relatively little transient effects. If not, the method may terminate at 330 as the battery system may not be rested. If so, the method may proceed to 332.

At 332, if the flag is set at 322 indicating that the calculated SOC may be used, a determination may be made whether the calculated SOC is usable. If not, the method may proceed to terminate at 330 as the battery system may not be rested. If so, the method may proceed to 334. At 334, the estimated capacity SOC for the battery system passed at 324 may be stored along with associated time information in one or more data bins determined by the associated BOL SOC. In some embodiments, the time information may comprise a running count associated to a time when a system implementing embodiments of the disclosed systems and methods is powered (e.g., connected to a 12V battery or the like).

A determination may be made at 336 whether the sections of the battery system (e.g., battery system subdivisions) have uniform and/or substantially uniform capacity. If the sections do not have uniform and/or substantially uniform capacity, the method may proceed to 340 where an average voltage of the sections, which may be scaled to a pack-level voltage, may be stored in one or more data bins determined by the associated BOL SOC. If the sections have uniform and/or substantially uniform capacity, the method may proceed to 338 where the pack voltage may be stored in one or more data bins determined by the associated BOL SOC.

At 342, it may be determined whether a sufficient number of data bins include new data since a prior update. If not, the method may terminate at 352 as insufficient data for the method to proceed may have been collected. If so, the method may proceed to 344, where it may be determined whether the spread of the data is sufficient. If not, the method may terminate at 352 as insufficient data for the method may have been collected. If so, the method may proceed to 346.

At 346, it may be determined whether the new data is centered at about 50%. If not, the method may terminate at 352 as insufficient data for the method may have been collected. If so, the method may proceed to 348, where it may be determined whether the new data locations are sufficiently varied. If not, the method may terminate at 352 as insufficient data for the method may have been collected. If so, a line fitting process may be triggered at 350. In certain embodiments, steps 342-348 may, among other things, ensure that enough data, spanning a sufficiently wide range, is stored so that an accurate line fit may be calculated covering a full range of relevant SOC.

The line fitting process may begin by creating an array of voltage-based SOC data from stored voltages and the BOL OCV/SOC curve at 354. At 356, a determination may be made whether the sections of the battery system (e.g., battery system subdivisions) have uniform and/or substantially uniform capacity. If the sections have uniform and/or substantially uniform capacity, the method may proceed to 358 where the line fitting process may be performed using a single call (e.g., N=1). Otherwise, the method may proceed to 360 where the line fitting process may be performed for each section (e.g., 1<n<=12).

In some embodiments, certain embodiments of the disclosed methods may be applied in connection with an entire battery pack, a pack as a number of sections, and/or an individual cell based on available measurement information. In some embodiments, the methods may be used in connection with a weakest section and/or cell of the battery system (e.g., a first battery section). If the battery sections/cells are relatively uniform, the first section may be considered to be representative of the pack and thus be used in connection with embodiments of the disclosed methods.

A line fitting process may be performed at 364 to determine a slope of a line representing a BOL SOC of the battery system plotted against the voltage-based SOC of the battery system. In certain embodiments, any suitable line fitting algorithm (e.g., least-squares, etc.) may be used to find the slope of the line in connection with step 364. At 362, a determination may be made whether the line fitting process has 364 has been performed for every relevant section (e.g., as may be determined by steps 358, 360). If so, the method may proceed to 366. If not the line fitting process at 364 may continue to iterate until it is determined that the process has been performed for every relevant section.

At 366, a resulting estimated capacity value may be calculated based on the BOL battery capacity and a ratio computed based on the estimated slope of the line and stored in a blending buffer. A mean and a variance of the blending buffer values may be calculated at 368. At 370, a recursive least squares ("RLS") filter constant may be computed based on the calculated mean and the variance. A filter may be applied using the computed RLS constant to the new capacity estimate and previously stored capacity estimates at 372. The new blended capacity estimate may be stored at 374, and be used by a BSE system in connection with a variety of battery system operating and/or parameter determinations.

Figure 4:
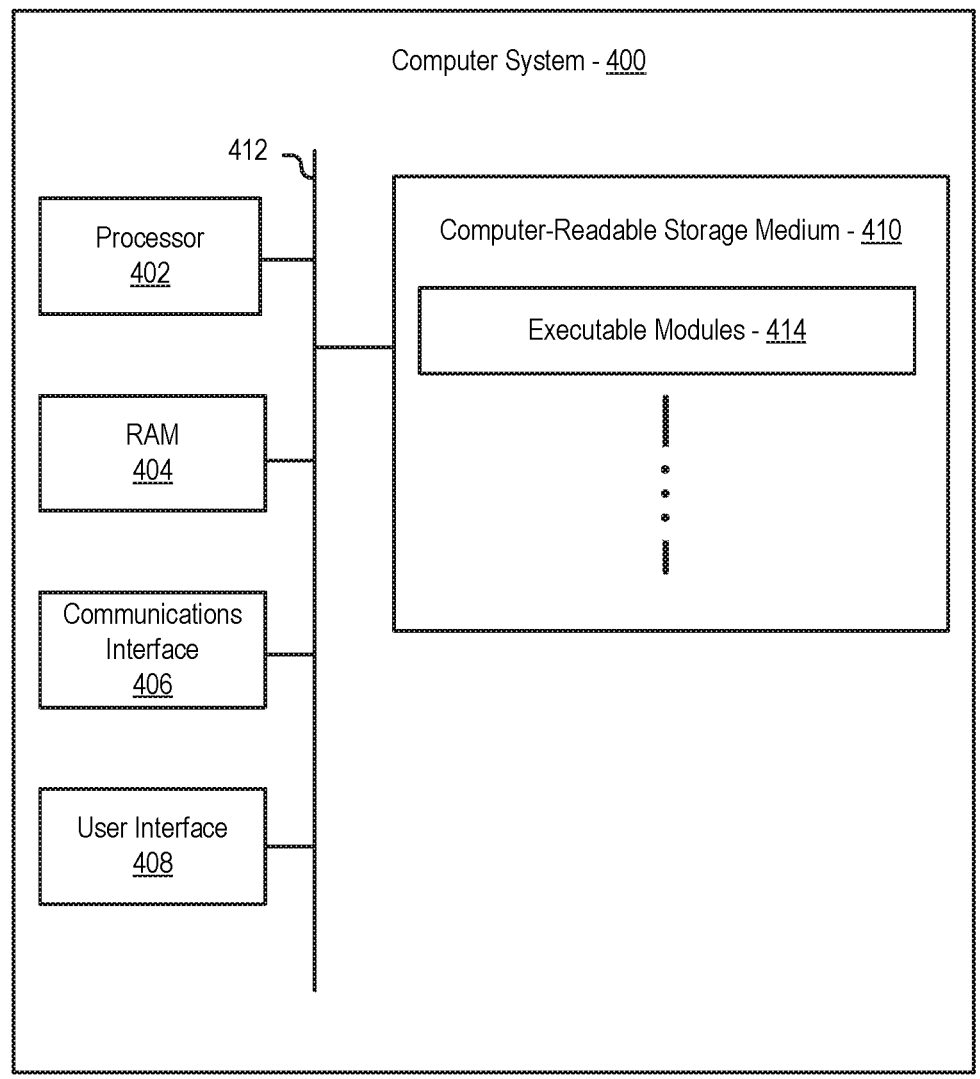
FIG. 4 illustrates an exemplary system for implementing certain embodiments of the systems and methods disclosed herein.

FIG. 4 illustrates an exemplary system 400 for implementing certain embodiments of the systems and methods disclosed herein. In certain embodiments, the computer system 400 may be a personal computer system, a server computer system, an on-board or internal vehicle computer, a battery control system, an external computer system, and/or any other type of system suitable for implementing the disclosed systems and methods. In further embodiments, the computer system 400 may be any portable electronic computer system or electronic device including, for example, a notebook computer, a smartphone, and/or a tablet computer.

As illustrated, the computer system 400 may include, among other things, one or more processors 402, random access memory ("RAM") 404, a communications interface 406, a user interface 408, and a non-transitory computer-readable storage medium 410. The processor 402, RAM 404, communications interface 406, user interface 408, and computer-readable storage medium 410 may be communicatively coupled to each other via a common data bus 412. In some embodiments, the various components of the computer system 400 may be implemented using hardware, software, firmware, and/or any combination thereof.

User interface 408 may include any number of devices allowing a user to interact with the computer system 400. For example, user interface 408 may be used to display an interactive interface to a user. The user interface 408 may be a separate interface system communicatively coupled with the computer system 400 or, alternatively, may be an integrated system such as a display interface for a laptop or other similar device. In certain embodiments, the user interface 408 may be produced on a touch screen display. The user interface 408 may also include any number of other input devices including, for example, keyboard, trackball, and/or pointer devices.

The communications interface 406 may be any interface capable of communicating with other computer systems, peripheral devices, and/or other equipment communicatively coupled to computer system 400. For example, the communications interface 506 may allow the computer system 400 to communicate with other computer systems (e.g., computer systems associated with external databases and/or the Internet), allowing for the transfer as well as reception of data from such systems. The communications interface 406 may include, among other things, a modem, a satellite data transmission system, an Ethernet card, and/or any other suitable device that enables the computer system 400 to connect to databases and networks, such as LANs, MANs, WANs and the Internet.

Processor 402 may include one or more general purpose processors, application specific processors, programmable microprocessors, microcontrollers, digital signal processors, FPGAs, other customizable or programmable processing devices, and/or any other devices or arrangement of devices that are capable of implementing the systems and methods disclosed herein.

Processor 402 may be configured to execute computer-readable instructions stored on non-transitory computer-readable storage medium 410. Computer-readable storage medium 410 may store other data or information as desired. In some embodiments, the computer-readable instructions may include computer executable functional modules 414. For example, the computer-readable instructions may include one or more functional modules configured to implement all or part of the functionality of the systems and methods described above. Specific functional models that may be stored on computer-readable storage medium 410 may include modules to estimate a capacity of a battery system and/or any other module or modules configured to implement the systems and methods disclosed herein.

The system and methods described herein may be implemented independent of the programming language used to create the computer-readable instructions and/or any operating system operating on the computer system 400. For example, the computer-readable instructions may be written in any suitable programming language, examples of which include, but are not limited to, C, C++, Visual C++, and/or Visual Basic, Java, Perl, or any other suitable programming language. Further, the computer-readable instructions and/or functional modules may be in the form of a collection of separate programs or modules, and/or a program module within a larger program or a portion of a program module. The processing of data by computer system 500 may be in response to user commands, results of previous processing, or a request made by another processing machine. It will be appreciated that computer system 400 may utilize any suitable operating system including, for example, Unix, DOS, Android, Symbian, Windows, iOS, OSX, Linux, and/or the like.

Although the foregoing has been described in some detail for purposes of clarity, it will be apparent that certain changes and modifications may be made without departing from the principles thereof. It is noted that there are many alternative ways of implementing both the processes and systems described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A method of estimating a capacity of a battery system comprising:
    determining voltage-based state of charge ("SOC") data of a portion of the battery system based on measured portion voltage information and a relationship between an open circuit voltage ("OCV") and the SOC of the portion at a beginning of life of the portion;
    determining beginning of life SOC data of the portion based on coulomb counting measurements;
    determining a ratio based on the beginning of life SOC data of the portion and the voltage-based SOC data of the portion;
    determining an estimated present capacity of the portion based on the beginning of life capacity of the portion and the ratio; and
    implementing a control action in a vehicle associated with the battery system based on the estimated present capacity.

2. The method of claim 1, wherein the relationship between the OCV and the SOC of the portion comprises an OCV/SOC curve associated with the portion.

3. The method of claim 1, wherein the ratio comprises a ratio between a beginning of life capacity of the portion and the estimated present capacity of the portion.

4. The method of claim 1, wherein determining the ratio comprises:
    plotting the beginning of life SOC data of the portion against the voltage-based SOC data of the portion;
    performing a line fitting process to identify a line associated with the plotting of the beginning of life SOC data of the portion and the voltage-based SOC data of the portion;
    determining a slope of the identified line; and
    determining the ratio based on the identified slope.

5. The method of claim 1, wherein the line fitting process comprises a recursive least squares line fitting process.

6. The method of claim 1, wherein the method further comprises determining at least one operating parameter of the battery system based the estimated present capacity.

7. A method of estimating a capacity of a battery system comprising:
   determining voltage-based state of charge ("SOC") data of the battery system based on measured voltage information and a relationship between an open circuit voltage ("OCV") and the SOC of the battery system at a beginning of life of the battery system;
   determining beginning of life SOC data of the battery system based on coulomb counting measurements;
   determining a ratio based on the beginning of life SOC data of the battery system and the voltage-based SOC data of the battery system;
   determining an estimated present capacity of the battery system based on the beginning of life capacity of the battery system and the ratio; and
   implementing a control action in a vehicle associated with the battery system based on the updated battery capacity.

8. The method of claim 7, wherein the relationship between the OCV and the SOC of the battery system comprises an OCV/SOC curve associated with the battery system.

9. The method of claim 7, wherein the ratio comprises a ratio between a beginning of life capacity of the battery system and the estimated present capacity of the battery system.

10. The method of claim 7, wherein determining the ratio comprises:
    plotting the beginning of life SOC data of the battery system against the voltage-based SOC data of the battery system;
    performing a line fitting process to identify a line associated with the plotting of the beginning of life SOC data of the battery system and the voltage-based SOC data of the battery system;
    determining a slope of the identified line; and
    determining the ratio based on the identified slope.

11. The method of claim 7, wherein the line fitting process comprises a recursive least squares line fitting process.

12. The method of claim 7, wherein the method further comprises determining at least one operating parameter of the battery system based on updated battery capacity.

13. A non-transitory computer-readable storage medium storing instructions that, when executed by a processor, cause the processor to perform a method for estimating a capacity of a battery system comprising:
    determining voltage-based state of charge ("SOC") data of a portion of the battery system based on measured portion voltage information and a relationship between an open circuit voltage ("OCV") and the SOC of the portion at a beginning of life of the pack;
    determining beginning of life SOC data of the portion based on coulomb counting measurements;
    determining a ratio based on the beginning of life SOC data of the portion and the voltage-based SOC data of the portion;
    determining an estimated present capacity of the portion based on the beginning of life capacity of the portion and the ratio; and
    implementing a control action in a vehicle associated with the battery system based on the updated battery capacity.

14. The non-transitory computer-readable storage medium of claim 13, wherein the relationship between the OCV and the SOC of the portion comprises an OCV/SOC curve associated with the portion.

15. The non-transitory computer-readable storage medium of claim 13, wherein the ratio comprises a ratio between a beginning of life capacity of the portion and the estimated present capacity of the portion.

16. The non-transitory computer-readable storage medium of claim 13, wherein determining the ratio comprises:
    plotting the beginning of life SOC data of the portion against the voltage-based SOC data of the portion;
    performing a line fitting process to identify a line associated with the plotting of the beginning of life SOC data of the portion and the voltage-based SOC data of the portion;
    determining a slope of the identified line; and
    determining the ratio based on the identified slope.

17. The non-transitory computer-readable storage medium of claim 13, wherein the line fitting process comprises a recursive least squares line fitting process.

18. The non-transitory computer-readable storage medium of claim 13, wherein the method further comprises determining at least one operating parameter of the battery system based on estimated present capacity.

* * * * *